US012615831B2

(12) United States Patent
Tokuda

(10) Patent No.: US 12,615,831 B2
(45) Date of Patent: Apr. 28, 2026

(54) SEMICONDUCTOR DEVICE

(71) Applicant: RENESAS ELECTRONICS CORPORATION, Tokyo (JP)

(72) Inventor: Satoru Tokuda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 385 days.

(21) Appl. No.: 18/330,660

(22) Filed: Jun. 7, 2023

(65) Prior Publication Data

US 2024/0088238 A1 Mar. 14, 2024

(30) Foreign Application Priority Data

Sep. 8, 2022 (JP) ................................. 2022-142921

(51) Int. Cl.
H10D 64/00 (2025.01)
H10D 30/66 (2025.01)

(52) U.S. Cl.
CPC ......... H10D 64/118 (2025.01); H10D 30/668 (2025.01); H10D 64/117 (2025.01)

(58) Field of Classification Search
CPC .... H10D 64/118; H10D 30/66; H10D 64/117; H10D 64/518; H10D 62/127; H10D 30/60; H10D 64/513
See application file for complete search history.

(56) References Cited

U.S. PATENT DOCUMENTS 6,635,544 B2 * 10/2003 Disney ................. H10D 30/635
438/270
9,711,637 B2 7/2017 Numabe et al.

2002/0185680 A1 * 12/2002 Henninger ........... H10D 30/668
257/330
2004/0089910 A1 * 5/2004 Hirler .................. H10D 30/668
257/500
2010/0140697 A1 * 6/2010 Yedinak ............... H10D 62/126
257/334
2016/0240614 A1 * 8/2016 Okuhata .............. H10D 62/111
2016/0351702 A1 * 12/2016 Numabe .............. H10D 62/158
2019/0198660 A1 * 6/2019 Kachi .................. H10D 62/106
2021/0249535 A1 * 8/2021 Nagata ................. H10D 64/514

FOREIGN PATENT DOCUMENTS

JP 2016-152357 A 8/2016
JP 2019-114643 A 7/2019
WO 2015/114803 A1 8/2015

OTHER PUBLICATIONS

Office Action dated Oct. 7, 2025, issued in corresponding JP Application No. 2022-142921, 10 pages.

* cited by examiner

*Primary Examiner* — Galina G Yushina
(74) *Attorney, Agent, or Firm* — Rimon P.C.

(57) ABSTRACT

A semiconductor device includes a trench formed in an n-type semiconductor substrate, a p-type body region, an n-type source region, a field plate electrode formed at a lower portion of the trench, and a gate electrode formed at an upper portion of the trench. A gate potential is to be supplied to the gate electrode, a source potential is to be supplied to the source region and the body region, and a drain potential is to be supplied to the semiconductor substrate. A potential larger than the source potential and smaller than the drain potential is to be supplied to the field plate electrode.

8 Claims, 13 Drawing Sheets

A-A CROSS SECTION

B-B CROSS SECTION

*FIG. 3*

C–C CROSS SECTION

<STUDIED EXAMPLE>

POTENTIAL DISTRIBUTION AT TIME OF OFF

POTENTIAL DISTRIBUTION AT TIME OF ON

*FIG. 9*

|  | STUDIED EXAMPLE | FIRST EMBODIMENT |
|---|---|---|
| BVdss | 1.00 | 1.00 |
| ON-RESISTANCE (Vg=4.5V) | 1.00 | 0.75 |

(RELATIVE VALUE)

*FIG. 10*

| Vfp [V] | THICKNESS OF INSULATING FILM IF1 [Å] | THICKNESS OF GATE INSULATING FILM GI [Å] |
|---|---|---|
| 5.0 | 400 | 300 |
| 10.0 | 300 | 300 |
| 15.0 | 200 | 300 |

D-D CROSS SECTION

SEMICONDUCTOR DEVICE

CROSS-REFERENCE TO RELATED APPLICATIONS

The disclosure of Japanese Patent Application No. 2022-142921 filed on Sep. 8, 2022 including the specification, drawings and abstract is incorporated herein by reference in its entirety.

BACKGROUND

The present invention relates to a semiconductor device, and particularly relates to a semiconductor device including a gate electrode and a field plate electrode in a trench.

In a semiconductor device including a semiconductor element such as a power MOSFET (Metal Oxide Semiconductor Field Effect Transistor), a trench gate structure in which a gate electrode is embedded in a trench is applied. As a type of the trench gate structure, there is a split gate structure in which a field plate electrode is formed at a lower portion in a trench and a gate electrode is formed at an upper portion in the trench. The same potential as that supplied (applied) to a source electrode is supplied (applied) to the field plate electrode. A depletion layer is expanded in a drift region by this field plate electrode, so that it becomes possible to increase a concentration in the drift region, and it becomes possible to reduce a resistance of the drift region.

There is disclosed a technique listed below.
[Patent Document 1] Japanese Unexamined Patent Application Publication No. 2019-114643

For example, Patent Document 1 discloses a semiconductor device to which a split gate structure having a gate electrode and a field plate electrode is applied.

SUMMARY

In order to reduce an ON-resistance of the power MOSFET, a method for shrinking a cell pitch and reducing resistances of a drift region and a channel region has been adopted. However, since it is necessary to shrink dimensions of the trenches and respective contact holes in such a method, it becomes difficult to process them. Moreover, there is also a fear that a charge balance (more specifically, an inclination of a curve that represents the charge balance) may become steep (unstable) due to such shrink.

When the charge balance becomes steep, a withstand voltage between a source and a drain fluctuates greatly in the case in which there occur variations in a resistance value of the drift region, a width of the trench, and a thickness of an insulating film for the field plate electrode. Hence, it becomes difficult to ensure a manufacturing margin.

A main object of this application is to provide a technique that makes it possible to reduce the ON-resistance without shrinking the cell pitch while ensuring the manufacturing margin. Thereby, performance of the semiconductor device is enhanced. Other objects and novel features will be apparent from the description in this specification and the accompanying drawings.

Outlines of representative embodiments disclosed in this application will be briefly described below.

A semiconductor device according to one embodiment includes: a semiconductor substrate of a first conductivity type, the semiconductor substrate having an upper surface and a lower surface; a trench formed in the upper surface of the semiconductor substrate; a body region of a second conductivity type opposite to the first conductivity type, the body region being formed in the semiconductor substrate so as to be shallower than a depth of the trench in cross-sectional view; a source region of the first conductivity type, the source region being formed in the body region; a field plate electrode formed inside the trench at a lower portion of the trench; a gate electrode formed inside the trench at an upper portion of the trench and electrically insulated from the field plate electrode; a first insulating film formed inside the trench between the semiconductor substrate and the field plate electrode; and a gate insulating film formed inside the trench between the semiconductor substrate and the gate electrode. Here, a gate potential is to be supplied to the gate electrode, a source potential is to be supplied to each of the source region and the body region, a drain potential is to be supplied to the semiconductor substrate, a first potential larger than the source potential and smaller than the drain potential is to be supplied to the field plate electrode, and a thickness of the first insulating film is smaller than twice a thickness of the gate insulating film.

According to one embodiment, the performance of the semiconductor device can be enhanced.

BRIEF DESCRIPTION OF THE DRAWINGS

FIG. 3 is an enlarged plan view showing the main portion of the semiconductor device in the first embodiment.

FIG. 9 is a table showing a measurement result of the simulation by the inventor of this application.

FIG. 10 is a table showing a study result by the inventor of this application.

FIG. 13 is an enlarged plan view showing the main portion of the semiconductor device in the second embodiment.

DETAILED DESCRIPTION

Figure 1:
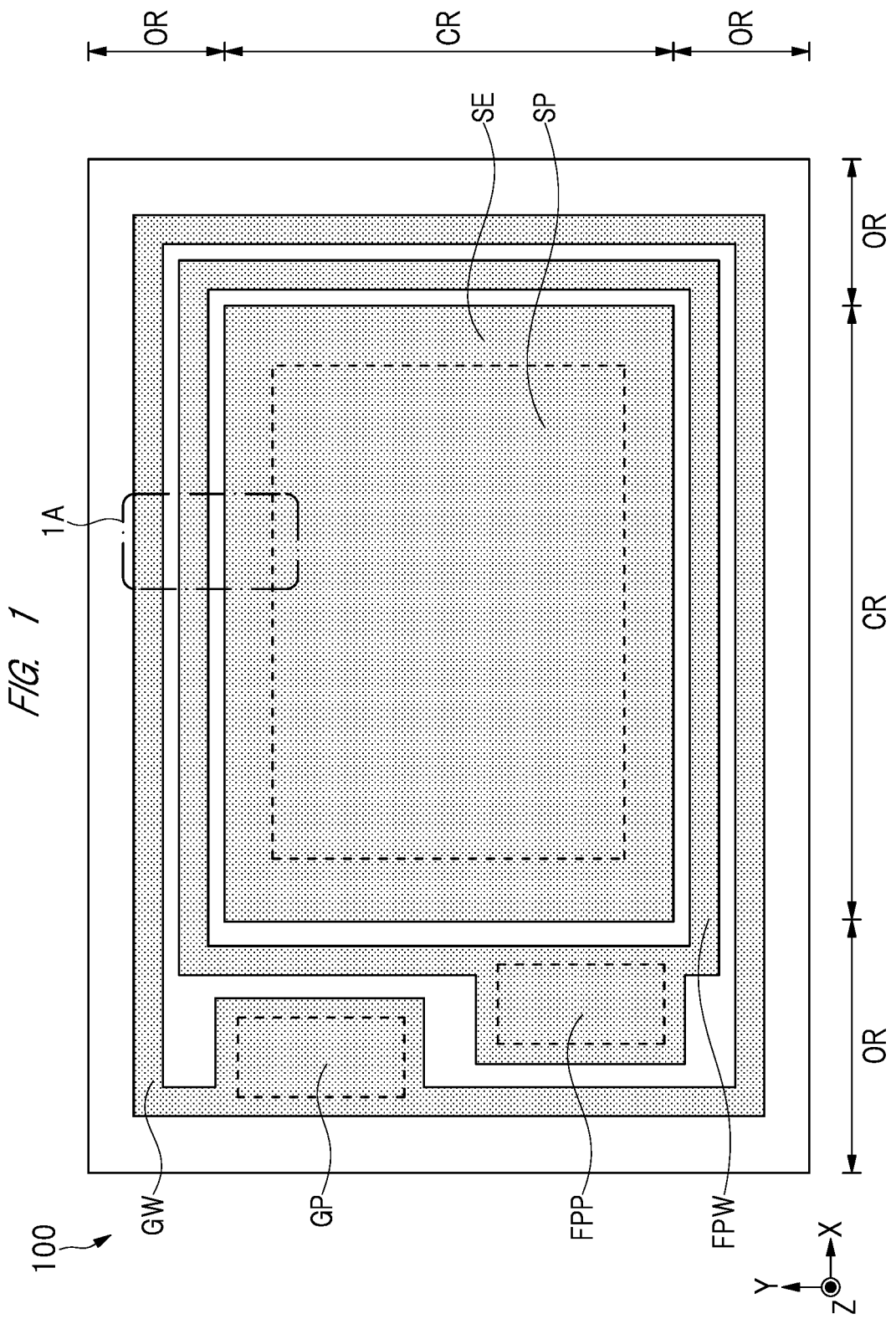
FIG. 1 is a plan view showing a semiconductor device in a first embodiment.

Hereinafter, embodiments will be described in detail with reference to the drawings. Note that, in all the drawings for describing the embodiments, the members having the same function are denoted by the same reference characters, and repetitive descriptions thereof will be omitted. Moreover, in the following embodiments, the description of the same or similar portions will not be repeated in principle unless particularly necessary.

Moreover, an X-direction, a Y-direction and a Z-direction described in this application intersect one another, and are perpendicular to one another. In this application, the Z-direction will be described as an up-down direction, a height direction, or a thickness direction of a certain structure. Further, an expression such as a "plan view" or "in plan view" for use in this application means that a plane formed by the X-direction and the Y-direction is defined as a "flat plane" and this "flat plane" is viewed from the Z-direction.

First Embodiment

<Structure of Semiconductor Device>

A semiconductor device 100 in the first embodiment will be described below with reference to FIG. 1 to FIG. 5. The semiconductor device 100 includes a MOSFET with a trench gate structure as a semiconductor element. Moreover, the MOSFET of the first embodiment forms a split gate structure including a gate electrode GE and a field plate electrode FP.

Figure 2:
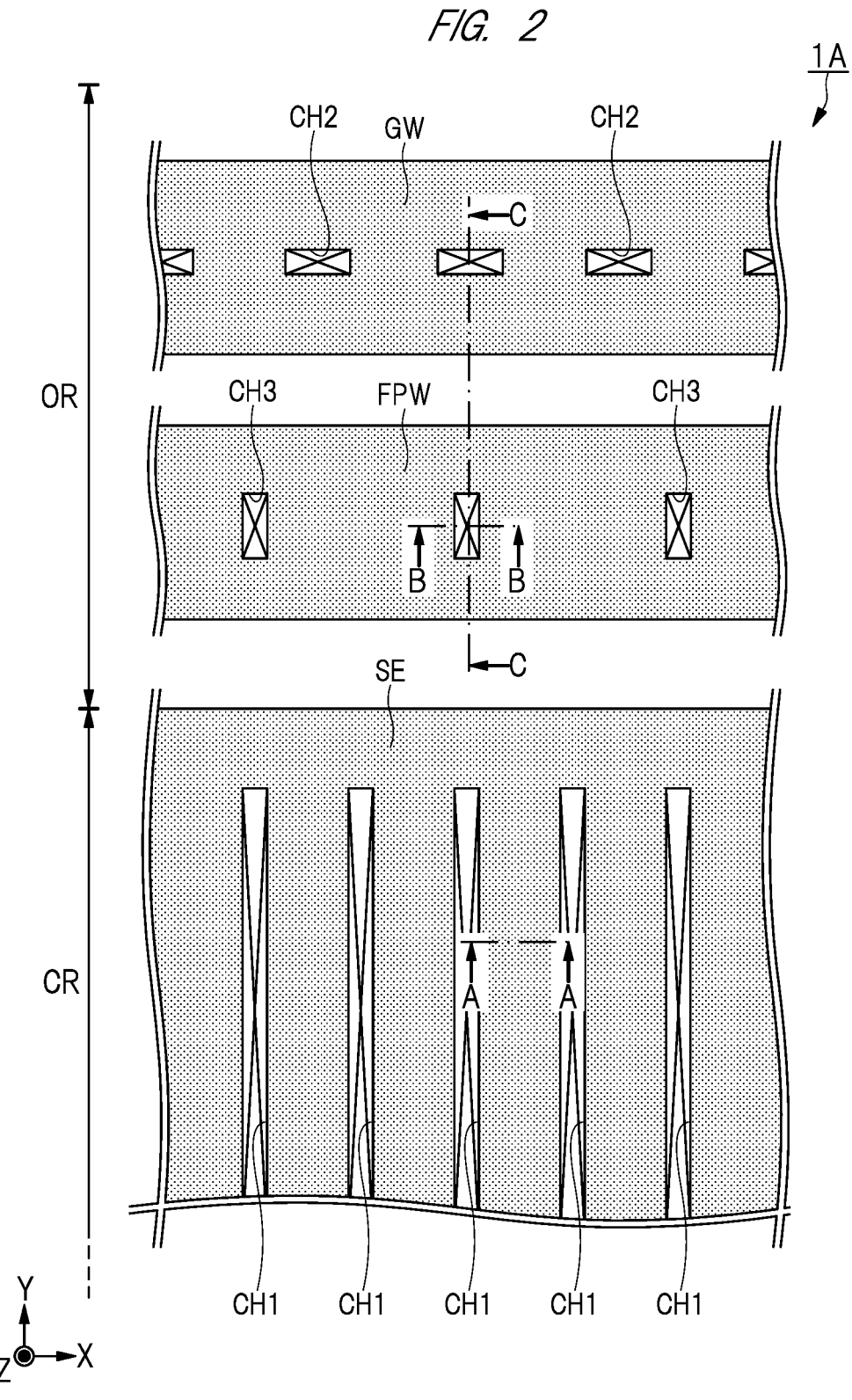
FIG. 2 is an enlarged plan view showing a main portion of the semiconductor device in the first embodiment.
Figure 3:
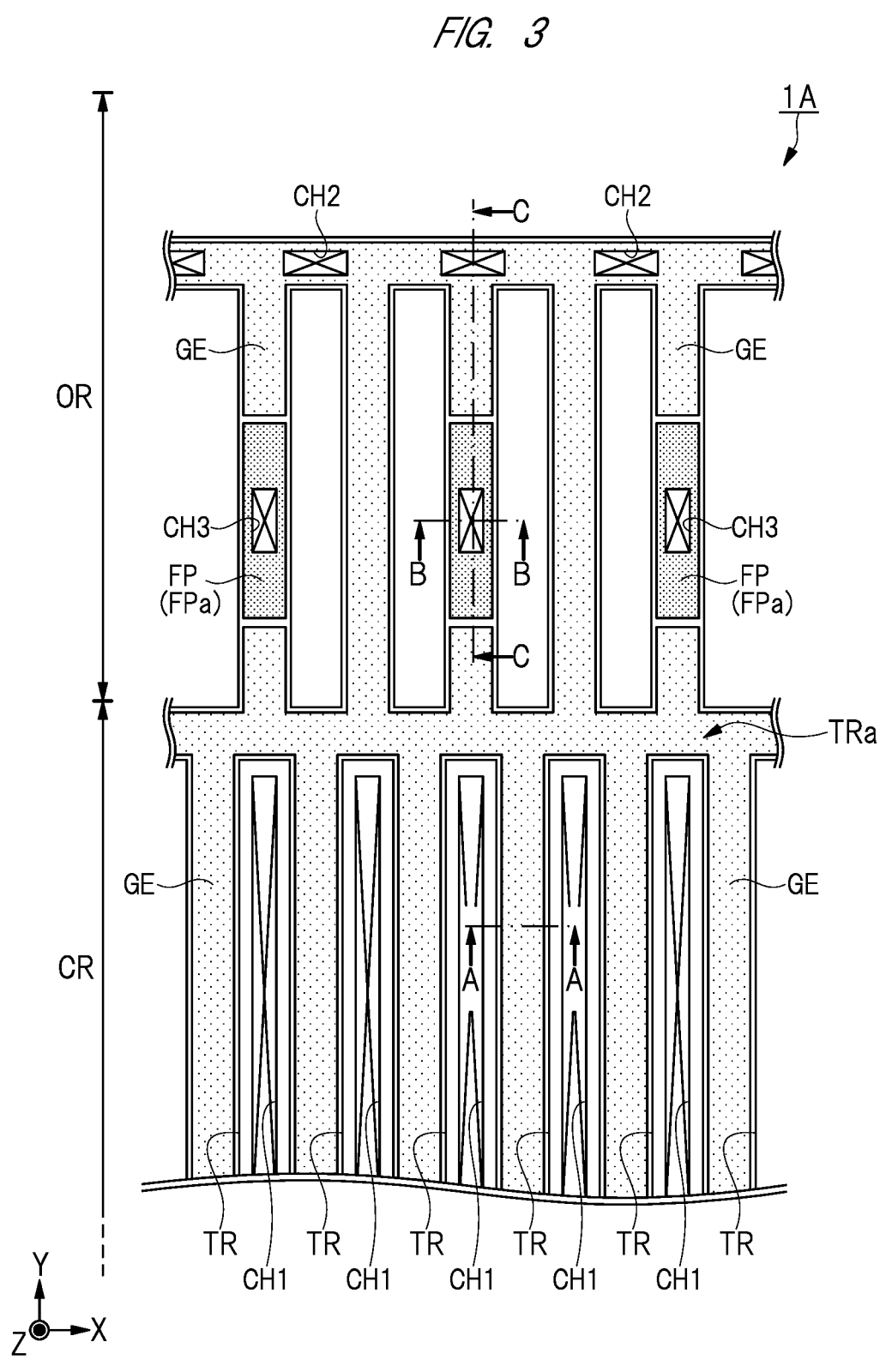

FIG. 1 is a plan view of a semiconductor chip that is the semiconductor device 100. FIG. 2 and FIG. 3 are plan views each showing a region 1A in FIG. 1 in an enlarged manner. FIG. 1 and FIG. 2 mainly show a wiring pattern formed above a semiconductor substrate SUB. FIG. 3 shows a structure below FIG. 2, that is, a structure of a trench gate formed in the semiconductor substrate SUB.

Moreover, the semiconductor device 100 includes a cell region and an outer periphery region OR that surrounds the cell region CR in plan view. In the cell region CR, main semiconductor elements such as a plurality of MOSFETs are formed. In the outer periphery region OR, a gate wiring GW and a field plate wiring FPW are provided. In the outer periphery region OR, the gate wiring GW is electrically connected to the gate electrode GE, and the field plate wiring FPW is electrically connected to the field plate electrode FP.

As shown in FIG. 1, a most part of the semiconductor device 100 is covered with a source electrode SE. The field plate wiring FPW surrounds the source electrode SE in plan view. The gate wiring GW surrounds the field plate wiring FPW in plan view.

Although not shown herein, the source electrode SE, the gate wiring GW, and the field plate wiring FPW are covered with a protective film such as a polyimide film. A part of the above-described protective film is provided with openings, and the source electrode SE, the gate wiring GW, and the field plate wiring FPW, which are exposed at those openings, serve as a source pad SP, a gate pad GP, and a field plate pad FPP. External connection members such as wires or clips (copper plates) are connected onto the source pad SP, the gate pad GP, and the field plate pad FPP, so that the semiconductor device 100 is electrically connected to other semiconductor chips or wiring boards.

The main feature of this application is that a potential other than a source potential is to be supplied to the field plate electrode FP. Therefore, unlike the prior art, the field plate wiring FPW for supplying an independent potential to the field plate electrode FP is provided. The feature regarding such a field plate electrode FP will be described later in detail.

Positions of holes CH1 to CH3 shown in FIG. 3 coincide with positions of holes CH1 to CH3 shown in FIG. 2. As shown in FIG. 3, in the cell region CR and the outer periphery region OR, a plurality of trenches TR extends in the Y-direction, and is adjacent to one another in the X-direction. Moreover, the plurality of trenches TR which extends in the Y-direction communicates with one another by a coupling portion TRa that extends in the X-direction. In each of the trenches TR, the field plate electrode FP is formed at a lower portion (a lower part) of the trench TR, and the gate electrode GE is formed at an upper portion (an upper part) of the trench TR.

A part of the field plate electrode FP forms a contact portion FPa. Inside the trench TR in the cell region CR, the field plate electrode FP that composes the contact portion FPa is formed not only at the lower portion of the trench TR but also at the upper portion of the trench TR.

As shown in FIG. 3, the gate electrode GE and the contact portion FPa are exposed from the semiconductor substrate SUB. In the outer periphery region OR, the holes CH2 are formed on the gate electrode GE, and the holes CH3 are formed on the contact portions FPa. The gate electrode GE is electrically connected to the gate wiring GW through the holes CH2. The contact portions FPa are electrically connected to the field plate wiring FPW through the holes CH3. Moreover, in the cell region CR, the holes CH1 are formed on a source region NS and on a body region PB. The source region NS and the body region PB are electrically connected to the source electrode SE through the holes CH1.

As mentioned above, the plurality of trenches TR communicates with one another by the coupling portion TRa, and accordingly, the field plate electrodes FP and the gate electrodes GE which are formed in the plurality of trenches TR are integrated and are conducted with each other. Hence, in the outer periphery region OR, a field plate potential supplied to the contact portions FPa is to be supplied to all the field plate electrodes FP in the cell region CR.

Moreover, the gate electrode GE in the outer periphery region OR is divided in the Y-direction by each of the contact portions FPa, but the contact portions FPa are formed in a part of the plurality of trenches TR which extends in the Y-direction, and are not formed in all the trenches TR. Therefore, the gate potential supplied in the outer periphery region OR is to be supplied to all the gate electrodes GE in the cell region CR.

Note that the coupling portion TRa is provided in the vicinity of a boundary between the cell region CR and the outer periphery region OR, and connects the respective trenches TR to one another between the holes CH1 and the holes CH3.

Figure 4:
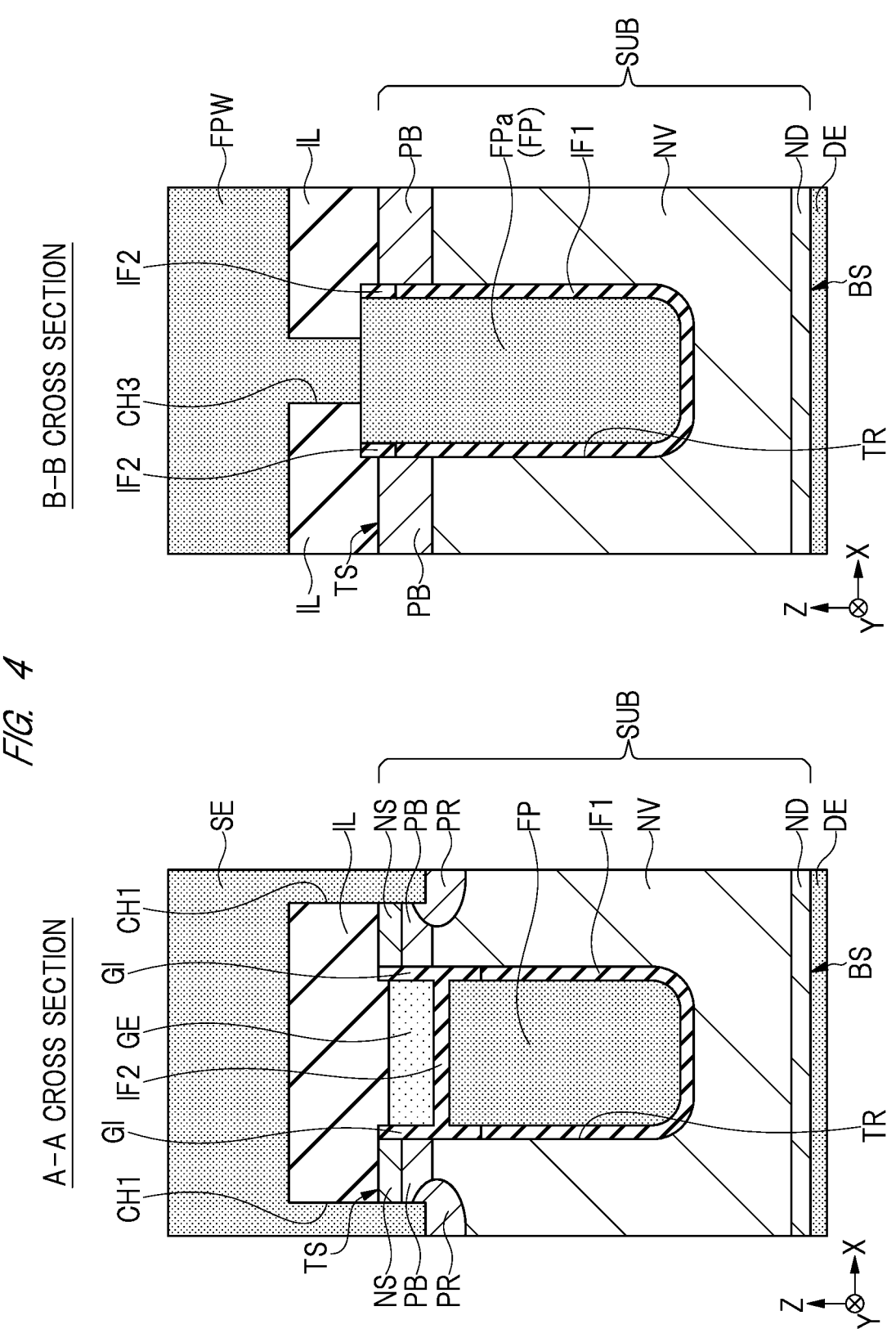
FIG. 4 is a cross-sectional view showing the semiconductor device in the first embodiment.
Figure 5:
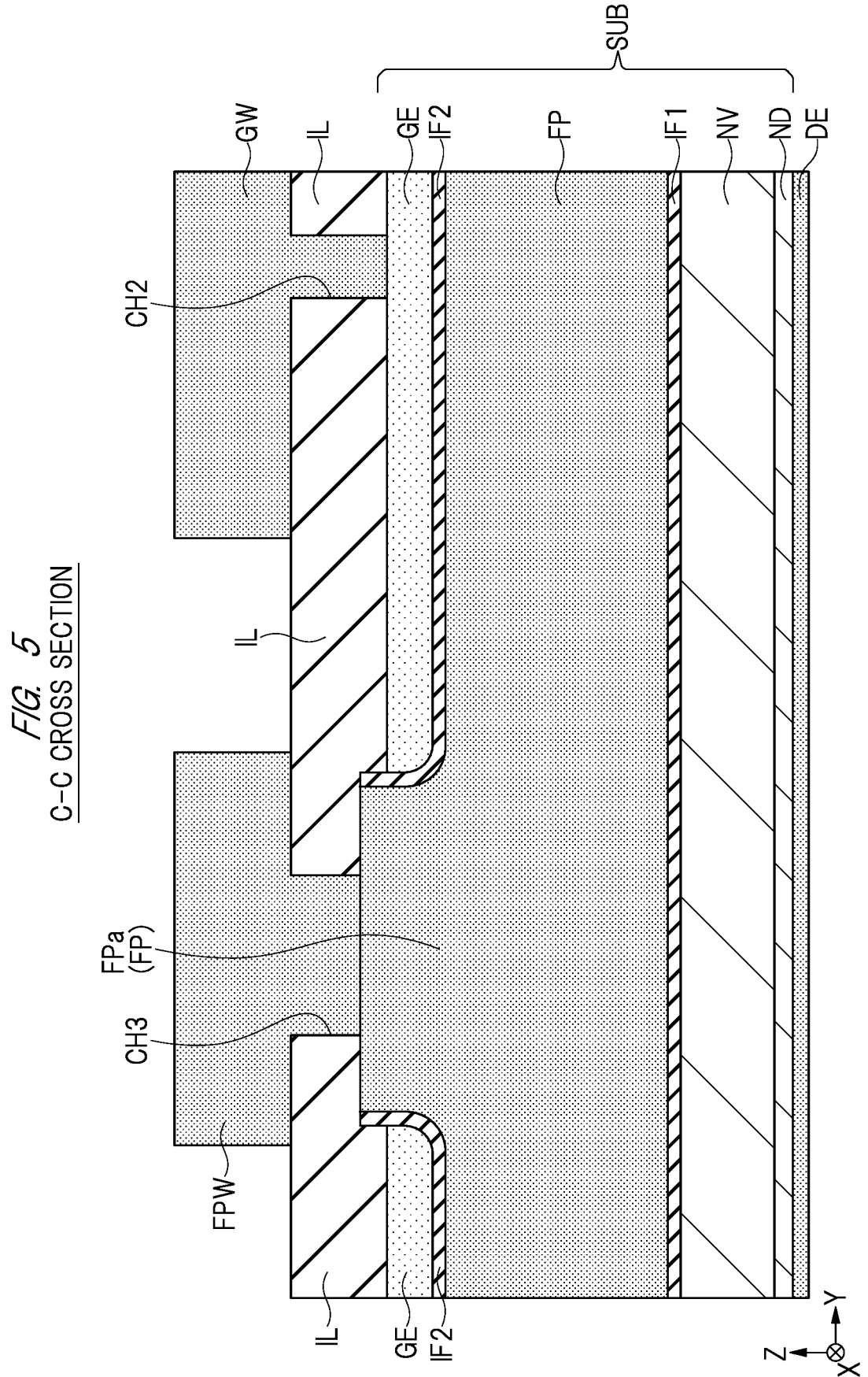
FIG. 5 is a cross-sectional view showing the semiconductor device in the first embodiment.

A cross-sectional structure of the semiconductor device 100 will be described below with reference to FIG. 4 and FIG. 5. FIG. 4 is a cross-sectional view taken along a line A-A and a line B-B shown in FIG. 2 and FIG. 3. FIG. 5 is a cross-sectional view taken along a line C-C shown in FIG. 2 and FIG. 3.

First, with reference to the A-A cross section in FIG. 4, a basic configuration of the MOSFET will be described. The semiconductor device 100 includes the semiconductor substrate SUB having an upper surface TS and a lower surface BS. The semiconductor substrate SUB has an n-type drift region NV with a low concentration. Herein, the n-type semiconductor substrate SUB itself constitutes the drift region NV. Note that the drift region NV may be an n-type semiconductor layer grown while introducing phosphorus (P) into an n-type silicon substrate by epitaxial growth. In this application, a description will be given on the assumption that a stacked body composed of such an n-type silicon substrate and an n-type semiconductor layer is also the semiconductor substrate SUB.

On the side of the upper surface TS of the semiconductor substrate SUB, the trench TR which reaches a predetermined depth from the upper surface TS of the semiconductor substrate SUB is formed in the semiconductor substrate SUB. Inside the trench TR, the field plate electrode FP is formed at the lower portion of the trench TR via an insulating film IF1, and the gate electrode GE is formed at the upper portion of the trench TR via a gate insulating film GI.

A position of an upper surface of the insulating film IF1 is lower than a position of an upper surface of the field plate electrode FP. The gate insulating film GI is formed on the insulating film IF1 in the trench TR. On an upper surface and side surface of the field plate electrode FP exposed from the insulating film IF1, an insulating film IF2 is formed.

The insulating film IF1 is formed between the semiconductor substrate SUB and the field plate electrode FP. The insulating film IF2 is formed between the gate electrode GE and the field plate electrode FP. The gate insulating film GI is formed between the semiconductor substrate SUB and the gate electrode GE. By these insulating films, the semiconductor substrate SUB, the gate electrode GE, and the field plate electrode FP are electrically insulated from one another.

An upper surface of the gate electrode GE is retreated a little from the upper surface TS of the semiconductor substrate SUB. Each of the gate electrode GE and the field plate electrode FP is made of, for example, a polycrystalline silicon film into which n-type impurities are introduced. Each of the insulating film IF1, the insulating film IF2, and the gate insulating film GI is made of, for example, a silicon oxide film.

On the side of the upper surface of the semiconductor substrate SUB, a p-type body region PB is formed in the semiconductor substrate SUB so as to be shallower than the trench TR. An n-type source region NS is formed in the body region PB. The source region NS has an impurity concentration higher than that of the drift region NV.

On the side of the lower surface BS of the semiconductor substrate SUB, an n-type drain region ND is formed in the semiconductor substrate SUB. The drain region ND has an impurity concentration higher than that of the drift region NV. Under the lower surface BS of the semiconductor substrate SUB, a drain electrode DE is formed. A drain potential is to be supplied to the drain region ND and the semiconductor substrate SUB from the drain electrode DE. The drain electrode DE is made of, for example, a single metal film such as an aluminum film, a titanium film, a nickel film, a gold film, or a silver film, or a stacked film formed by depositing these metal films as appropriate.

On the upper surface TS of the semiconductor substrate SUB, an interlayer insulating film IL is formed so as to cover the trench TR. The interlayer insulating film IL is made of, for example, a silicon oxide film. Note that the interlayer insulating film IL may be a stacked film of a thin silicon oxide film and a thick silicon oxide film containing phosphorus (PSG: Phospho Silicate Glass film).

In the interlayer insulating film IL, the hole CH1 that reaches the source region NS and the body region PB is formed. At the bottom of the hole CH1, a high concentration diffusion region PR is formed in the body region PB. The high concentration diffusion region PR has an impurity concentration higher than that of the body region PB.

As shown in the A-A cross section in FIG. 4, in the cell region CR, the source electrode SE is formed on the interlayer insulating film IL. The source electrode SE is embedded in the hole CH1. Moreover, the source electrode SE is electrically connected to the source region NS, the body region PB, and the high concentration diffusion region PR, and supplies a source potential to these regions.

As shown in the B-B cross section in FIG. 4 and FIG. 5, a part of the field plate electrode FP composes the contact portion FPa of the field plate electrode FP. A position of an upper surface of the insulating film IF1 that is in contact with the field plate electrode FP other than the contact portion FPa is lower than a position of an upper surface of the insulating film IF1 that is in contact with the contact portion FPa. Moreover, a position of an upper surface of the contact portion FPa is higher than the position of the upper surface TS of the semiconductor substrate SUB. Note that the position of the upper surface of the contact portion FPa may be lower than or the same in height as the position of the upper surface TS of the semiconductor substrate SUB.

In the outer periphery region OR, the holes CH2 which reach the gate electrode GE and the holes CH3 which reach the contact portion FPa are formed in the interlayer insulating film IL. In the outer periphery region OR, the field plate wiring FPW and the gate wiring GW are formed on the interlayer insulating film IL. The gate wiring GW is embedded in the hole CH2, is electrically connected to the gate electrode GE, and supplies the gate potential to the gate electrode GE. The field plate wiring FPW is embedded in the hole CH3, is electrically connected to the contact portion FPa, and supplies the field plate potential to the field plate electrode FP.

Each of the source electrode SE, the gate wiring GW, and the field plate wiring FPW is made of, for example, a barrier metal film and a conductive film formed on the barrier metal film. The barrier metal film is, for example, a titanium nitride film, and the conductive film is, for example, an aluminum film.

Note that each of the source electrode SE, the gate wiring GW, and the field plate wiring FPW may be made of a plug layer that fills the inside of each of the holes CH1 to CH3 and a wiring layer formed on the interlayer insulating film IL. In that case, the wiring layer is made of the barrier metal film and the conductive film mentioned above. The plug layer is made of, for example, a stacked film of a barrier metal film such as a titanium nitride film and a conductive film such as a tungsten film.

Studied Example and Main Features of First Embodiment

Figure 6:
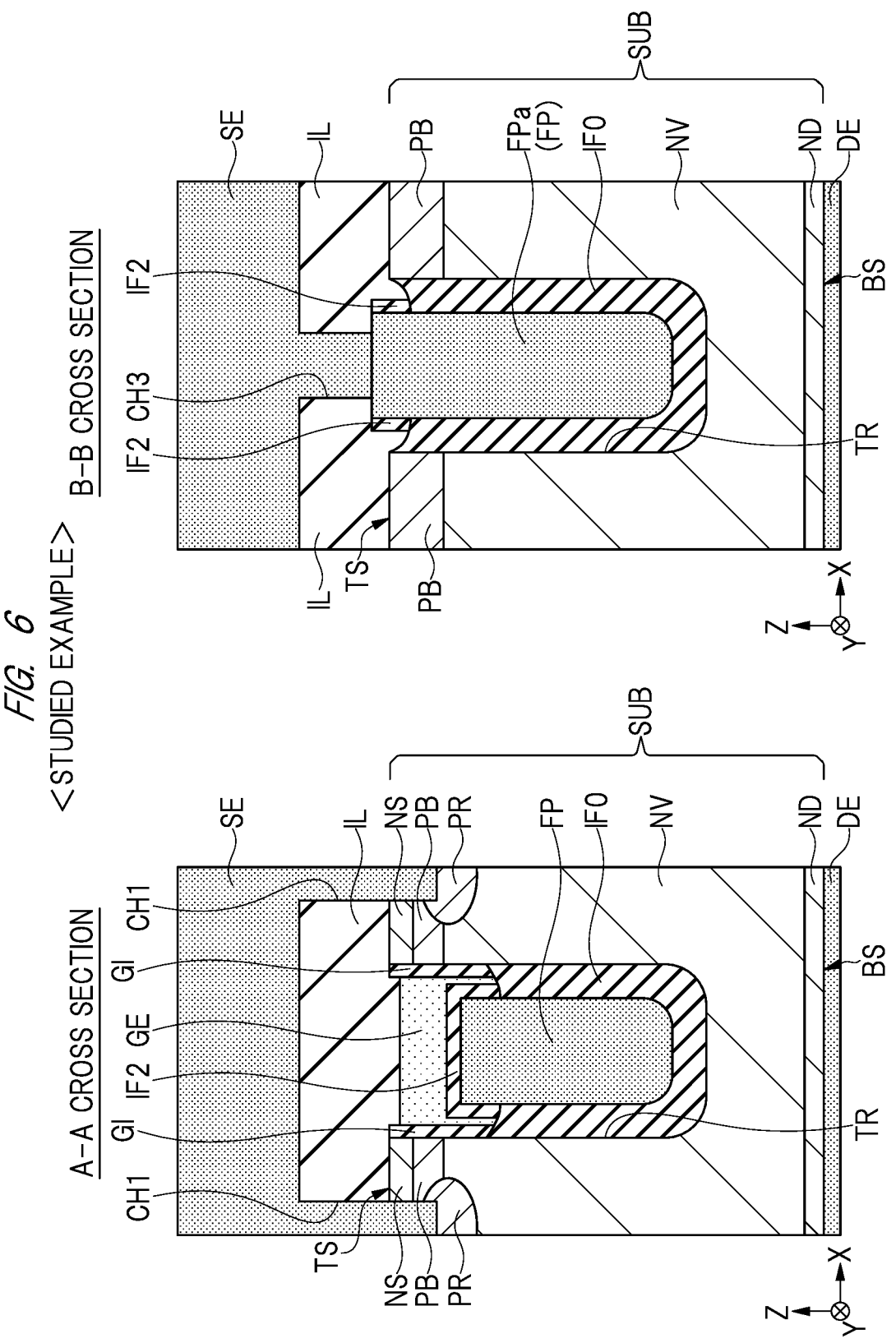
FIG. 6 is a cross-sectional view showing a semiconductor device in a studied example.

FIG. 6 is a cross-sectional view of a semiconductor device in a studied example that the inventor of this application has studied on the basis of Patent Document 1 and the like. As shown in FIG. 6, in the studied example, a thickness of the insulating film IF0 is sufficiently larger than a thickness of the gate insulating film GI, as compared with the insulating film IF1 of the first embodiment. Moreover, in the studied example, the field plate wiring FPW is not provided, and the field plate electrode FP is electrically connected to the source electrode SE. Therefore, the source potential is to be supplied to the field plate electrode FP of the studied example.

With reference to FIG. 7 to FIG. 10, a main feature of the first embodiment will be described below while comparing the studied example and the first embodiment with each other.

Figure 7:
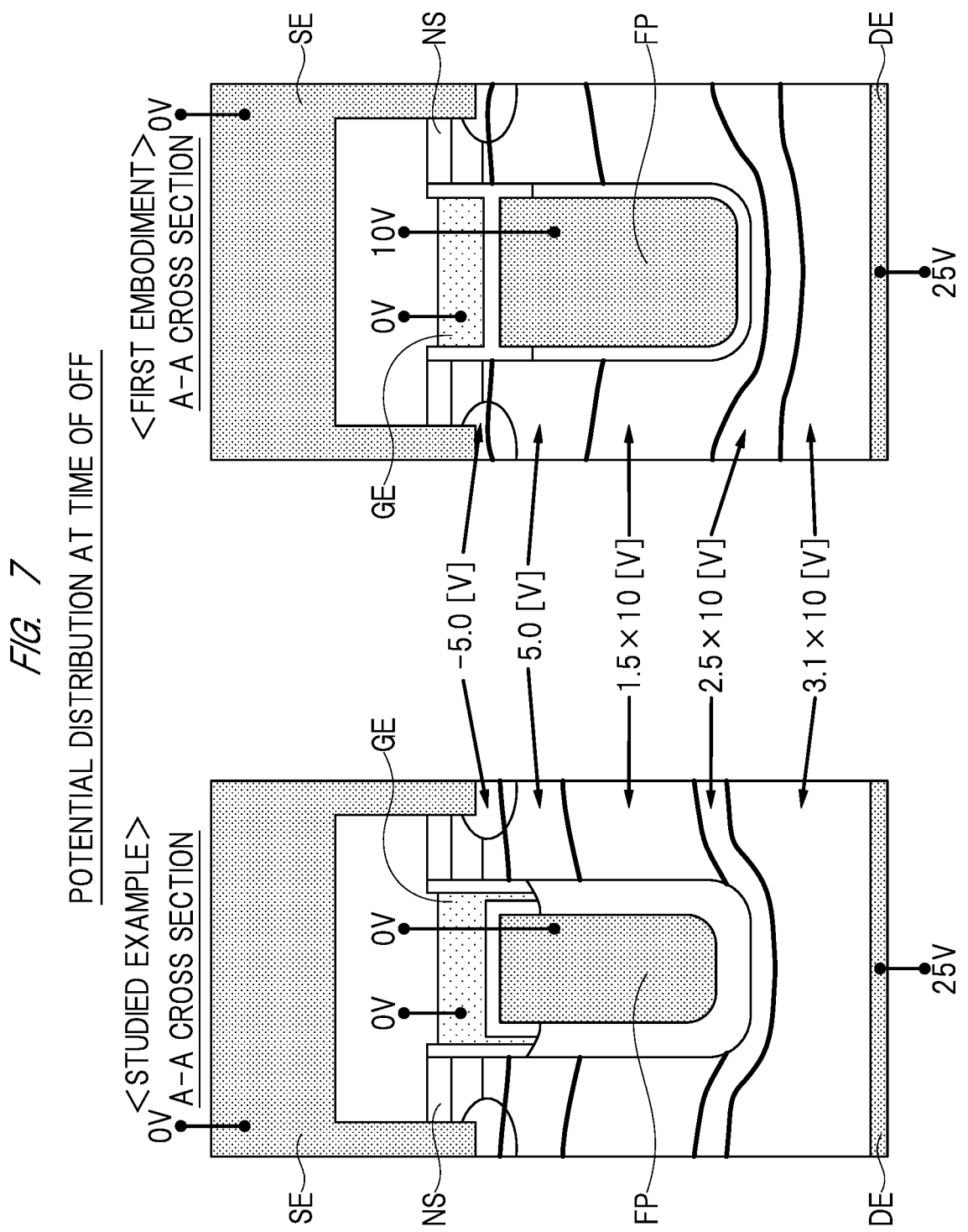
FIG. 7 is a schematic view showing a result of a simulation by an inventor of this application.
Figure 8:
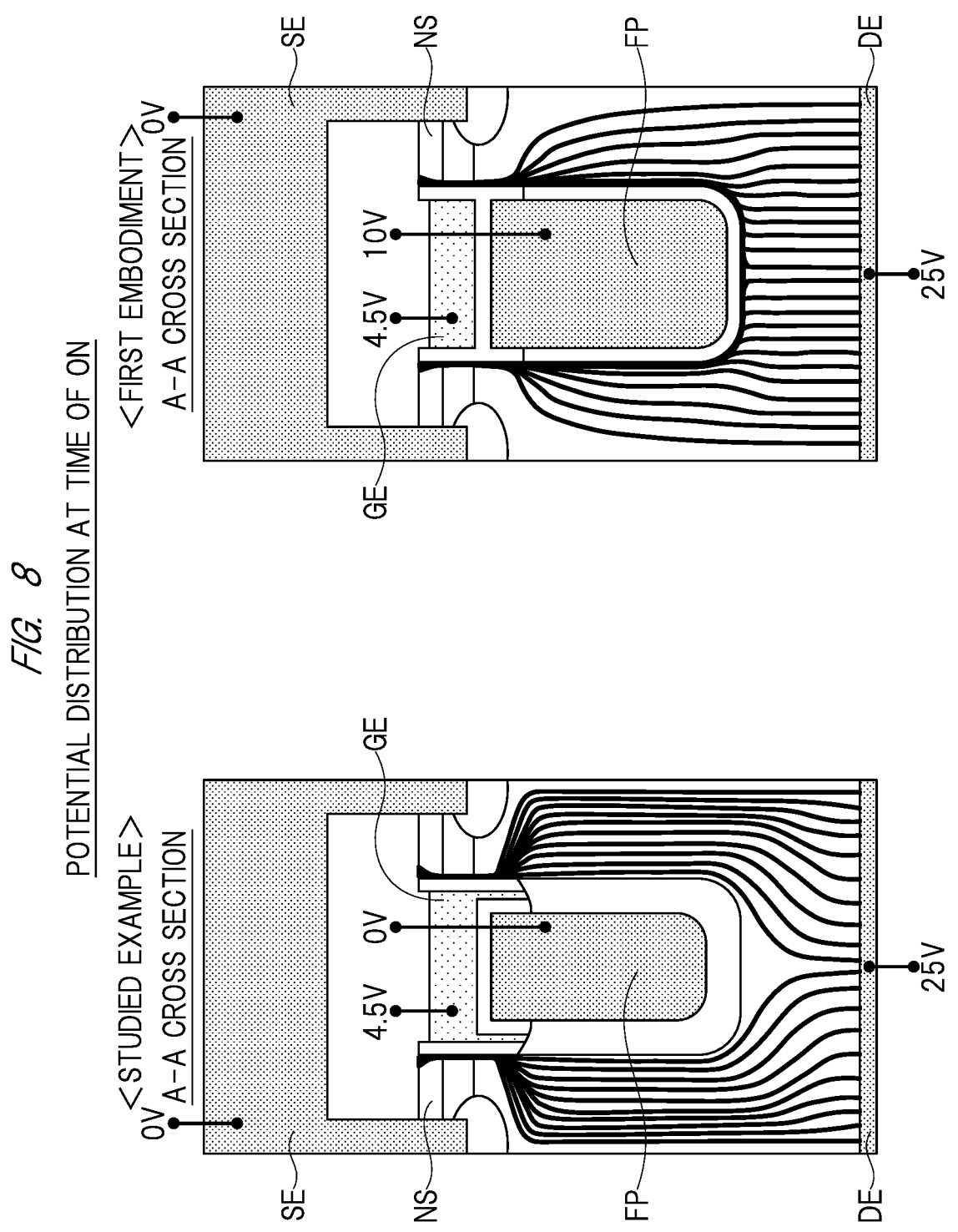
FIG. 8 is a schematic view showing the result of the simulation by the inventor of this application.

FIG. 7 shows potential distributions at a time of an OFF operation of the MOSFET with regard to the studied example and the first embodiment. FIG. 8 shows potential paths at a time of an ON operation of the MOSFET with regard to the studied example and the first embodiment. FIG. 9 is a table that provides a summary of measurement results of breakdown voltage BVdss and ON-resistance with regard to the studied example and the first embodiment.

Herein, a value of a potential Vfp to be supplied to the field plate electrode FP of the first embodiment is 10 V. The thickness of each of the gate insulating film GI and the insulating film IF2 is the same as each other in the studied example and the first embodiment, and is, for example, 300 Å (angstroms). Moreover, the thickness of the insulating film IF1 of the first embodiment is substantially the same as that of the gate insulating film GI, and is, for example, 300 Å (angstroms). That is, the thickness of the insulating film IF1 is smaller than twice the thickness of the gate insulating film GI. Meanwhile, the thickness of the insulating film IF0 of the studied example is, for example, 750 Å (angstroms). That is, the thickness of the insulating film IF0 is larger than twice the thickness of the gate insulating film GI.

Moreover, a description will be given below on the assumption that the potential supplied from the gate wiring GW to the gate electrode GE is a gate potential Vg, the potential supplied from the source electrode SE to the source region NS is a source potential Vs, the potential supplied from the drain electrode DE to the drain region ND is a drain potential Vd, and the potential supplied from the field plate wiring FPW to the field plate electrode FP is the potential Vfp. Note that, in the present embodiment, for example, the gate potential Vg is 4.5 V, the source potential Vs is 0 V, and the drain potential Vd is 25 V. However, any of the respective potential values mentioned above is merely an example, and for example, the source potential Vs may be a value other than 0 V.

As shown in FIG. 7, in the first embodiment, the value of the potential Vfp (potential value) at the time of the OFF operation is larger than the value of the source potential Vs (potential value). That is, the value of the potential Vfp at the time of the OFF operation is different from the value of the source potential Vs. More specifically, the value of the potential Vfp at the time of the OFF operation is larger than the value of the source potential Vs, and is smaller than the value of the drain potential Vd. Therefore, in comparison with the studied example (the potential Vs=0 V, the potential Vfp=0 V), a potential difference between the drain electrode DE and the field plate electrode FP is reduced, and an electric field strength in the vicinity of a bottom of the field plate electrode FP is reduced. Accordingly, even if the insulating film IF1 is thinned, an avalanche breakdown voltage is maintained, and a withstand voltage between the drain electrode DE and the source electrode SE is also maintained.

As shown in FIG. 8, in the first embodiment, the current tends to flow easily along the side surface and bottom surface of the trench TR as compared with the studied example. In the studied example, since the value of the potential Vfp at the time of the ON operation is the same value as the value of the source potential Vs, a carrier (electron) concentration at an interface between the semiconductor substrate SUB and the insulating film IF1 is equivalent to that in the other drift region NV. Hence, current paths spread relatively evenly.

Meanwhile, in the first embodiment, the value of the potential Vfp at the time of the ON operation is larger than the value of the source potential Vs. That is, the value of the potential Vfp at the time of the ON operation is different from the value of the source potential Vs. More specifically, the value of the potential Vfp at the time of the ON operation is larger than the value of the source potential Vs, and is smaller than the value of the drain potential Vd. Therefore, carriers (electrons) are accumulated at the interface between the semiconductor substrate SUB and the insulating film IF1. Accordingly, current paths are concentrated to the vicinities of the side surface and bottom surface of the trench TR. Hence, a drift resistance is reduced, and a reduction of the ON-resistance can be achieved. Particularly, as the thickness of the insulating film IF1 is reduced more, the carriers are more likely to be accumulated at the above-described interface, and accordingly, a further reduction of the ON-resistance can be achieved.

Moreover, since the thickness of the insulating film IF1 can be reduced, it becomes possible to reduce the width of the trenches TR. In that case, since the width of the drift region NV between the respective trenches TR can be increased, a further reduction of the ON-resistance can be achieved.

As shown in FIG. 9, there is no change in the breakdown voltage BVdss between the studied example and the first embodiment. That is, since the avalanche breakdown voltage is maintained in the first embodiment, the reliability of the semiconductor device 100 can be maintained. Moreover, in the first embodiment, the ON-resistance is reduced by 25% in comparison with the studied example. Hence, according to the first embodiment, the performance of the semiconductor device 100 can be enhanced while ensuring the manufacturing margin and maintaining the reliability of the semiconductor device 100 without shrinking the cell pitch.

FIG. 10 is a table that provides a summary of study results of the optimum thickness of the insulating film IF1 when the value of the potential Vfp is changed.

As the value of the potential Vfp is increased more, the potential difference between the drain electrode DE and the field plate electrode FP is reduced. Hence, even if the insulating film IF1 is thinned, the avalanche breakdown voltage is maintained. For example, when the potential Vfp is 5 V, the thickness of the insulating film IF1 can be made larger than the thickness of the gate insulating film GI, and can be set to, for example, 400 Å (angstroms). When the potential Vfp is 10 V, the thickness of the insulating film IF1 can be made substantially the same as the thickness of the gate insulating film GI, and can also be set to, for example, 300 Å (angstroms). When the potential Vfp is 15 V, the thickness of the insulating film IF1 can be made smaller than the thickness of the gate insulating film GI, and can also be set to, for example, 200 Å (angstroms). Note that the respective values described herein are merely examples, and can be arbitrarily changed unless departing from the scope of conditions to be described later.

Namely, if the value of the potential Vfp is a value close to the value of the gate potential Vg, then the thickness of the insulating film IF1 can be set to be large, and if the value of the potential Vfp is a value close to the value of the drain potential Vd, then the thickness of the insulating film IF1 can be set to be small. In other words, when the value of the potential Vfp is closer to the value of the gate potential Vg than to the value of the drain potential Vd, then it is preferable that the thickness of the insulating film IF1 is set to be larger than the thickness of the gate insulating film GI. Moreover, when the value of the potential Vfp is closer to the value of the drain potential Vd than to the value of the gate potential Vg, then it is preferable that the thickness of the insulating film IF1 is set to be smaller than the thickness of the gate insulating film GI.

Note that a degree of influence on the insulating film IF1b is different between the time of the OFF operation and the time of the ON operation. Namely, there is also a fear that the insulating film IF1 may be broken at the time of the ON operation depending on the thickness of the insulating film IF1 and the value of the potential Vfp to be applied. Therefore, although the case in which the value of the potential Vfp is 15 V has been described as an example of the case where the value of the potential Vfp is closer to the drain potential Vd than to the value of the gate potential Vg, the value of the potential Vfp may be, for example, 12.5 V. In addition, although the case in which the thickness of the insulating film IF1 is 200 Å (angstroms) has been described as an example of the case where the thickness of the insulating film IF1 is set to be smaller than the thickness of the gate insulating film GI, the thickness of the insulating film IF1 may be, for example, 250 Å (angstroms).

Moreover, the potential Vfp can also be made variable, and the value of the potential Vfp at the time of the OFF operation of the MOSFET can be made different from the value of the potential Vfp at the time of the ON operation of the MOSFET. For example, such specifications in which the potential Vfp is set to 20 V at the time of the OFF operation and the potential Vfp is set to 15 V at the time of the ON operation are also possible. In this operation where the potential Vfp is made variable, a balance between the avalanche breakdown voltage and the ON-resistance can be optimized in accordance with the thickness of the insulating film IF1.

Second Embodiment

A semiconductor device in a second embodiment will be described below with reference to FIG. 11 to FIG. 14. Note that, in the following description, differences from the first embodiment will be mainly described, and descriptions of the points that overlap with the first embodiment will be omitted.

Figure 11:
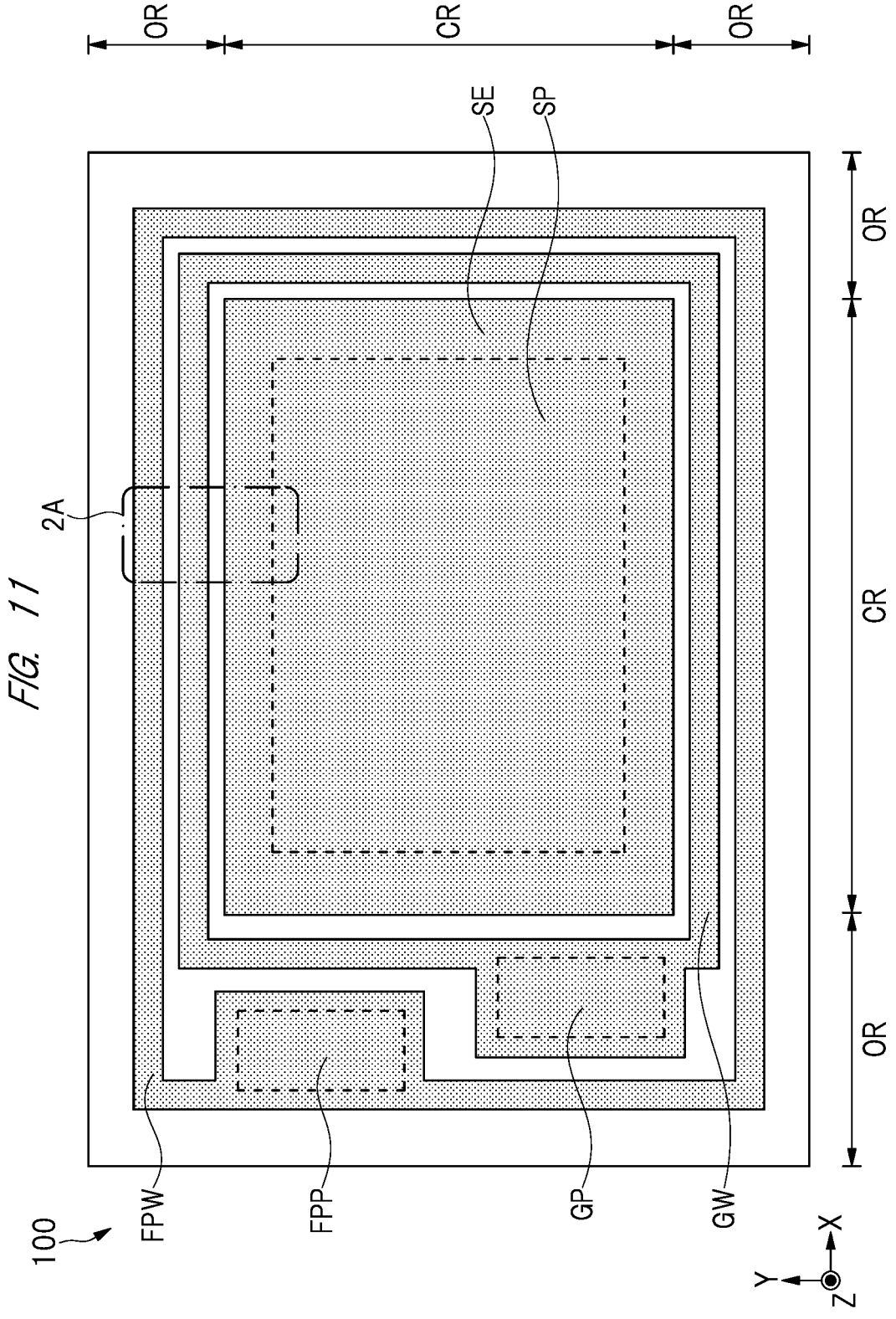
FIG. 11 is a plan view showing a semiconductor device in a second embodiment.
Figure 12:
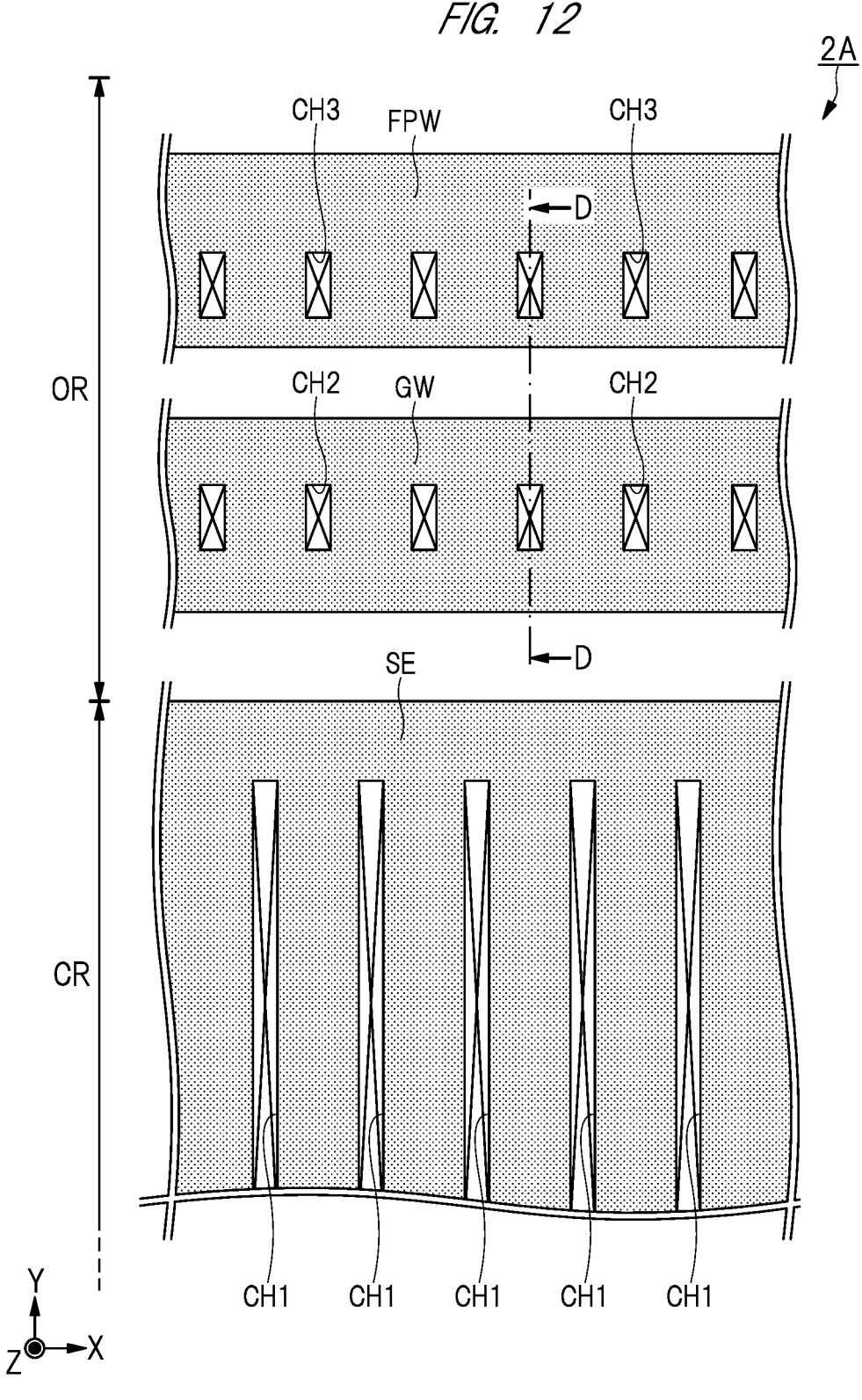
FIG. 12 is an enlarged plan view showing a main portion of the semiconductor device in the second embodiment.
Figure 13:
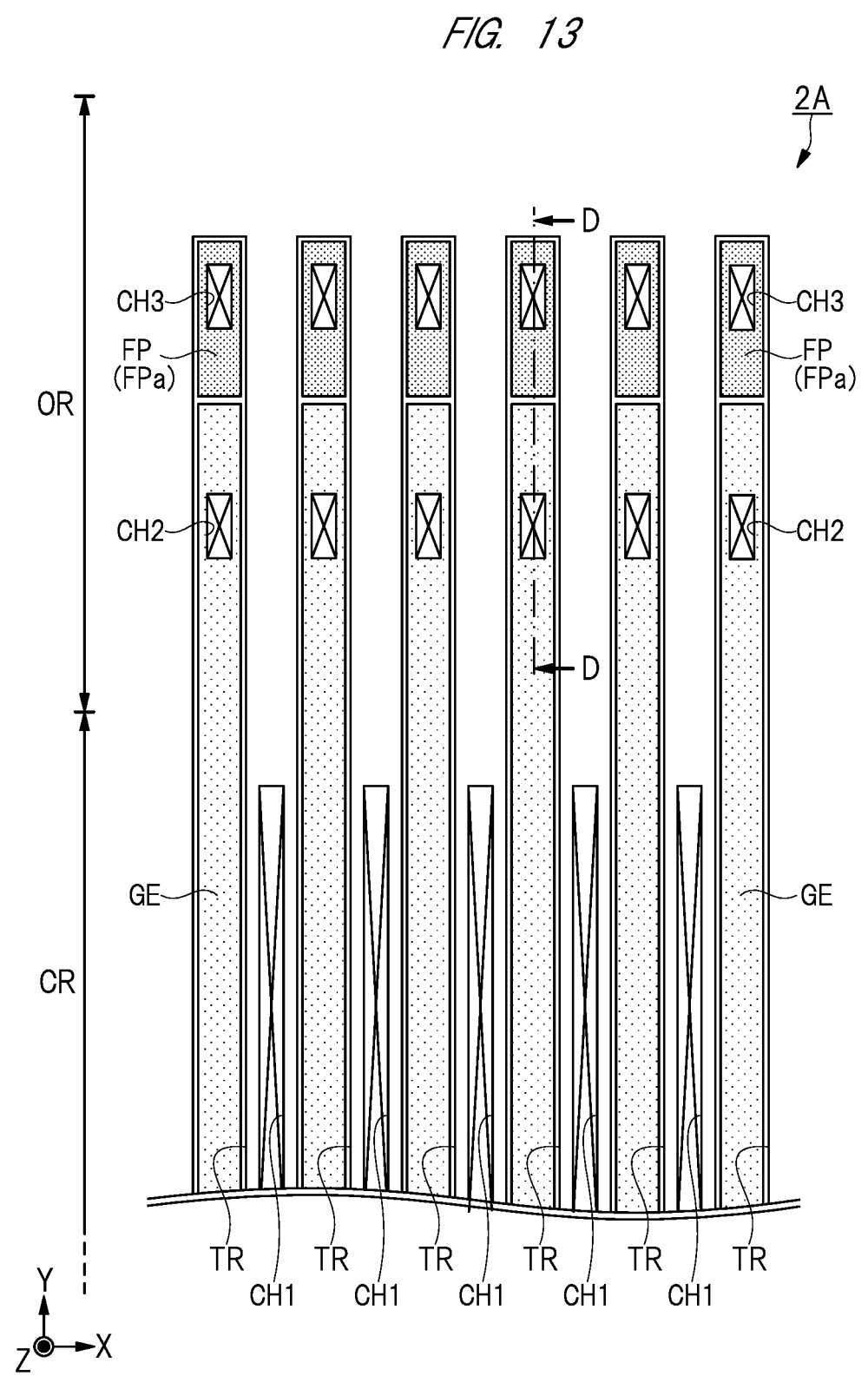
Figure 14:
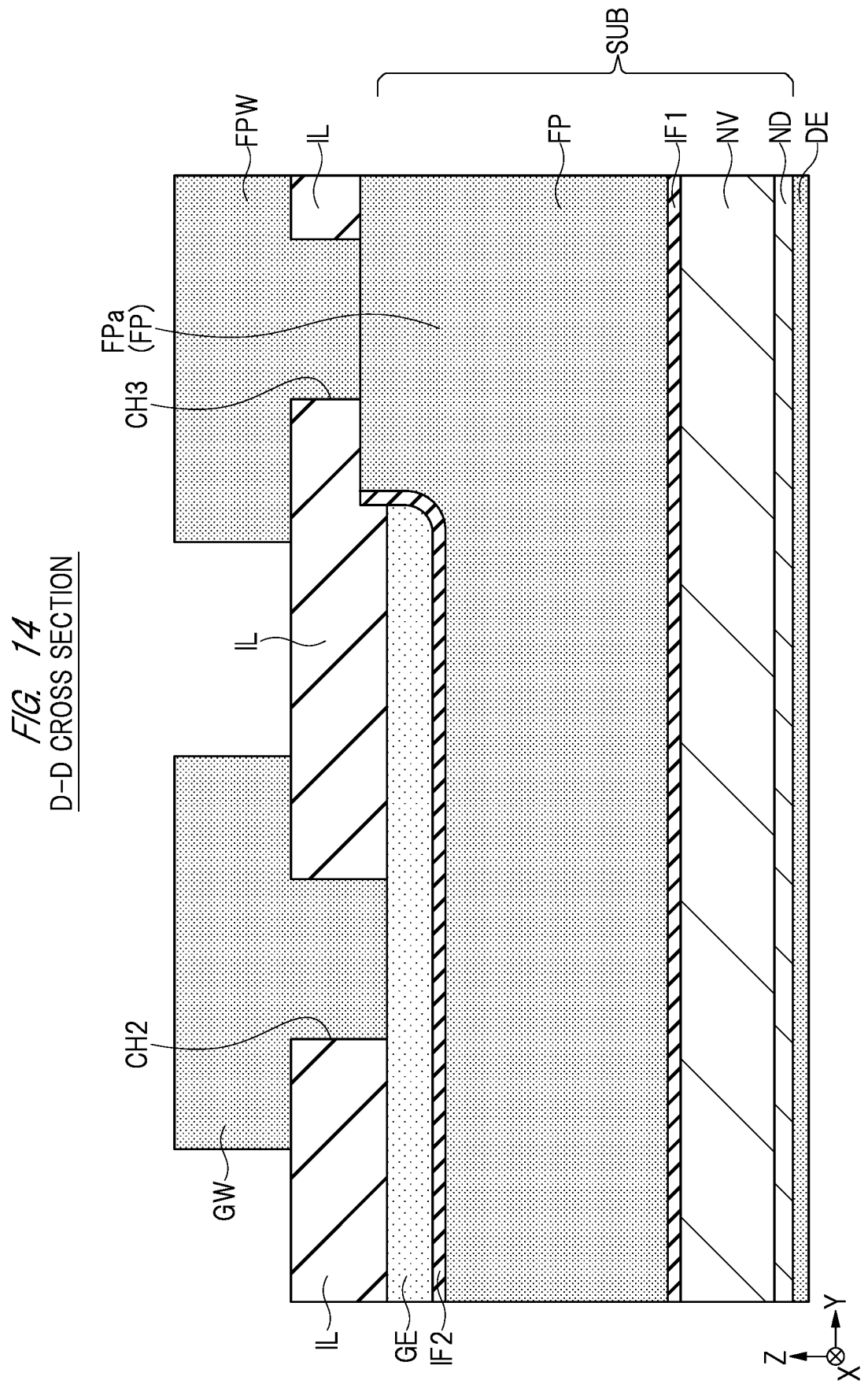
FIG. 14 is a cross-sectional view showing the semiconductor device in the second embodiment.

FIG. 11 is a plan view of a semiconductor chip that is the semiconductor device 100 in the second embodiment. FIG. 12 and FIG. 13 are plan views each showing a main portion of a region 2A in FIG. 11 in an enlarged manner. FIG. 13 shows a structure below that of FIG. 12, and shows a structure of a trench gate formed in the semiconductor substrate SUB. FIG. 14 is a cross-sectional view taken along a line D-D shown in FIG. 12 and FIG. 13.

In the second embodiment, formation positions of the field plate wiring FPW and the gate wiring GW are different from those in the first embodiment. As shown in FIG. 11 and FIG. 12, the gate wiring GW surrounds the source electrode SE in plan view. The field plate wiring FPW surrounds the gate wiring GW in plan view.

The plurality of trenches TR communicates with one another by the coupling portion TRa in the first embodiment, but the coupling portion TRa is not provided in the second embodiment, and the plurality of trenches TR is separated from one another in the X-direction as shown in FIG. 13.

Therefore, if the gate wiring GW is disposed on the outer periphery side of the field plate wiring FPW as in the first embodiment, the gate electrode GE in the outer periphery region OR is divided in the Y-direction by the contact portions FPa. Consequently, even if the gate wiring GW is connected to the gate electrode GE in the outer periphery region OR through the hole CH2, it becomes impossible to supply the gate potential Vg to the gate electrode GE in the cell region CR.

As shown in FIG. 13 and FIG. 14, the field plate wiring FPW is disposed on the outer periphery side of the gate wiring GW and the contact portions FPa are provided in the vicinities of the end portions of the trenches TR in the second embodiment. The gate wiring GW is connected to the gate electrodes GE in the outer periphery region OR through the holes CH2, so that the gate potential Vg can be supplied to the gate electrodes GE in the cell region CR. Moreover, the field plate wiring FPW is connected to the contact portions FPa through the holes CH3, so that the field plate potential Vfp can be supplied to the field plate electrodes FP in the cell region CR.

As described above, even if the plurality of trenches TR has such a planar layout as in the second embodiment, the field plate potential Vfp can be individually controlled independently of the source potential Vs, the gate potential Vg, and the drain potential Vd as in the first embodiment. Hence, also in the second embodiment, similar effects to those in the first embodiment can be obtained.

In the foregoing, the present invention has been specifically described based on the embodiments. However, the present invention is not limited to these embodiments and can be modified in various ways within the range not departing from the gist thereof.

What is claimed is:

1. A semiconductor device comprising:
a semiconductor substrate of a first conductivity type, the semiconductor substrate having an upper surface and a lower surface;
a trench formed in the semiconductor substrate and reaching a predetermined depth from the upper surface of the semiconductor substrate;
a body region of a second conductivity type opposite to the first conductivity type, the body region being formed in the semiconductor substrate so as to be shallower than a depth of the trench in cross-sectional view;
a source region of the first conductivity type, the source region being formed in the body region;
a field plate electrode formed inside the trench at a lower portion of the trench; a gate electrode formed inside the trench at an upper portion of the trench and electrically insulated from the field plate electrode;
a first insulating film formed inside the trench between the semiconductor substrate and the field plate electrode; and
a gate insulating film formed inside the trench between the semiconductor substrate and the gate electrode, wherein
a gate potential is to be supplied to the gate electrode, wherein
a source potential is to be supplied to each of the source region and the body region, wherein
a drain potential is to be supplied to the semiconductor substrate, wherein a first potential larger than the source potential and smaller than the drain potential is to be supplied to the field plate electrode, wherein
a thickness of the first insulating film is smaller than twice a thickness of the gate insulating film, wherein
the first potential is closer to the drain potential than to the gate potential.

2. The semiconductor device according to claim 1,
wherein the first potential is closer to the gate potential than to the drain potential, and
wherein the thickness of the first insulating film is larger than the thickness of the gate insulating film.

3. The semiconductor device according to claim 1, comprising a MOSFET including the semiconductor substrate, the trench, the gate insulating film, the gate electrode, the first insulating film, the field plate electrode, the body region, and the source region,
wherein the first potential to be supplied to the field plate electrode at a time of an OFF operation of the MOSFET is different from the first potential to be supplied to the field plate electrode at a time of an ON operation of the MOSFET.

4. The semiconductor device according to claim 1, further comprising:

an interlayer insulating film formed on the upper surface of the semiconductor substrate so as to cover the trench;

a source electrode formed on the interlayer insulating film;

a field plate wiring formed on the interlayer insulating film so as to surround the source electrode in plan view;

a gate wiring formed on the interlayer insulating film so as to surround the field plate wiring in plan view; and a drain electrode formed on the lower surface of the semiconductor substrate, wherein, inside the trench, a part of the field plate electrode is formed not only at the lower portion of the trench but also at the upper portion of the trench, and composes a contact portion of the field plate electrode, wherein a first hole reaching the source region and the body region, a second hole reaching the gate electrode, and a third hole reaching the contact portion are formed in the interlayer insulating film, wherein the source electrode is embedded in the first hole, is electrically connected to the source region and the body region, and supplies the source potential to the source region and the body region, wherein the gate wiring is embedded in the second hole, is electrically connected to the gate electrode, and supplies the gate potential to the gate electrode, wherein the field plate wiring is embedded in the third hole, is electrically connected to the field plate electrode, and supplies the first potential to the field plate electrode, and wherein the drain electrode supplies the drain potential to the semiconductor substrate.

5. The semiconductor device according to claim 4, wherein a plurality of trenches including the trench is formed in the semiconductor substrate, wherein the plurality of trenches each extends in a first direction in plan view, and communicates with one another by a coupling portion extending in a second direction perpendicular to the first direction in plan view, and wherein the contact portion is formed in a part of the plurality of trenches extending in the first direction.

6. The semiconductor device according to claim 1, further comprising:

an interlayer insulating film formed on the upper surface of the semiconductor substrate so as to cover the trench;

a source electrode formed on the interlayer insulating film;

a gate wiring formed on the interlayer insulating film so as to surround the source electrode in plan view;

a field plate wiring formed on the interlayer insulating film so as to surround the gate wiring in plan view; and a drain electrode formed on the lower surface of the semiconductor substrate, wherein, inside the trench, a part of the field plate electrode is formed not only at the lower portion of the trench but also at the upper portion of the trench, and composes a contact portion of the field plate electrode, wherein a first hole reaching the source region and the body region, a second hole reaching the gate electrode, and a third hole reaching the contact portion are formed in the interlayer insulating film, wherein the source electrode is embedded in the first hole, is electrically connected to the source region and the body region, and supplies the source potential to the source region and the body region, wherein the gate wiring is embedded in the second hole, is electrically connected to the gate electrode, and supplies the gate potential to the gate electrode, wherein the field plate wiring is embedded in the third hole, is electrically connected to the field plate electrode, and supplies the first potential to the field plate electrode, and wherein the drain electrode supplies the drain potential to the semiconductor substrate.

7. The semiconductor device according to claim 6, wherein a plurality of trenches including the trench is formed in the semiconductor substrate, and wherein the plurality of trenches each extends in a first direction in plan view, and is separated from one another in a second direction perpendicular to the first direction in plan view.

8. A semiconductor device comprising:

a semiconductor substrate of a first conductivity type, the semiconductor substrate having an upper surface and a lower surface;

a trench formed in the semiconductor substrate and reaching a predetermined depth from the upper surface of the semiconductor substrate;

a body region of a second conductivity type opposite to the first conductivity type, the body region being formed in the semiconductor substrate so as to be shallower than a depth of the trench in cross-sectional view;

a source region of the first conductivity type, the source region being formed in the body region;

a field plate electrode formed inside the trench at a lower portion of the trench;

a gate electrode formed inside the trench at an upper portion of the trench and electrically insulated from the field plate electrode;

a first insulating film formed inside the trench between the semiconductor substrate and the field plate electrode;

a gate insulating film formed inside the trench between the semiconductor substrate and the gate electrode; and a MOSFET including the semiconductor substrate, the trench, the gate insulating film, the gate electrode, the first insulating film, the field plate electrode, the body region, and the source region, wherein a gate potential is to be supplied to the gate electrode, wherein a source potential is to be supplied to each of the source region and the body region, wherein a drain potential is to be supplied to the semiconductor substrate, wherein a first potential larger than the source potential and smaller than the drain potential is to be supplied to the field plate electrode, wherein a thickness of the first insulating film is smaller than twice a thickness of the gate insulating film, and wherein the first potential to be supplied to the field plate electrode at a time of an OFF operation of the MOSFET is different from the first potential to be supplied to the field plate electrode at a time of an ON operation of the MOSFET.

* * * * *